United States Patent [19]
Gunther

[11] Patent Number: 5,200,656
[45] Date of Patent: Apr. 6, 1993

[54] CIRCUIT FOR MEASURING THE DIFFERENCE BETWEEN TWO SUCCESSIVE PERIODS IN A WAVEFORM

[75] Inventor: Richard D. Gunther, San Diego, Calif.

[73] Assignee: TRW Inc., Redondo Beach, Calif.

[21] Appl. No.: 856,420

[22] Filed: Mar. 23, 1992

[51] Int. Cl.[5] .................. G01R 19/12; G01R 29/02; H03K 5/22

[52] U.S. Cl. .................. 307/517; 307/234; 307/358; 328/111; 328/129.1

[58] Field of Search .............. 307/517, 510, 514, 519, 307/353, 358, 351, 234; 328/111, 114, 129.1

[56] References Cited

U.S. PATENT DOCUMENTS

| | | | |
|---|---|---|---|
| 3,600,688 | 8/1971 | Booth | 307/234 |
| 3,789,306 | 1/1974 | Hammerschlag | 307/351 |
| 4,845,382 | 7/1989 | Eouzan et al. | 307/358 |
| 5,005,427 | 4/1991 | Ohmae | 307/358 |
| 5,121,012 | 6/1992 | Orlov | 307/234 |

Primary Examiner—William L. Sikes
Assistant Examiner—Toan Tran
Attorney, Agent, or Firm—G. Gregory Schivley; Ronald L. Taylor

[57] ABSTRACT

An improved time discriminator system that is incorporated on a only a single gallium arsenide chip. The system includes a sensing stage, a ramping stage, a storage stage, a logic stage, and an output stage. An input signal is input to the sensing stage, which determines the length of successive time periods in the signal, and outputs corresponding control signals. The ramping stage generates dual ramping voltages on alternate periods of the input signal, corresponding to the successive period lengths. Values of the ramping voltages are sampled and held by a storage stage. Voltages held by the storage stage are subtracted from each other and amplified in a logic stage. The output stage resamples the signal coming from the logic stage, and outputs an analog signal that is proportional to the time difference between successive periods of the input signal.

11 Claims, 1 Drawing Sheet

CIRCUIT FOR MEASURING THE DIFFERENCE BETWEEN TWO SUCCESSIVE PERIODS IN A WAVEFORM

BACKGROUND OF THE INVENTION

1. Field of the Invention

This invention relates generally to a system for measuring the time difference between successive periods in a waveform, and more particularly to a Gallium-Arsenide (GaAs) Differential Time Measurement Chip that implements time discrimination using only a single chip.

2. Background of the Invention

Electronic warfare systems sometimes require the demodulation of aperiodic, asynchronous frequency transients in pulsed radio frequency signals. Quantitatively determining the time differences in successive periods of a waveform is essential to many electronic warfare applications. For example, in radar systems of the type capable of tracking a moving target, information as to each movement of the target is contained in the reflected signal. Change in position of the target can be determined by sensing the time change of successive periods of the reflected signal. In response to the change, an antenna may be automatically repositioned.

Advanced systems generally require resolution of time period differences of less than 10 pico-seconds. The use of high speed counters, common to many systems, is impractical to resolve such small time differences because extremely large clock rates, nearing 10 GHz, would be required. Further, the requirement of 10 psec resolution precludes the use of discrete components to implement this function. As a result, it is desirable to implement the time discrimination function using only integrated components on a single chip.

The present invention represents an improved time discriminator that is incorporated on only a single GaAs chip. Monolithic design has numerous advantages over a discrete configuration. Improved resolution and reduced power consumption result from the better device matching and reduced parasitic capacitances. Further, the GaAs system possesses a fast switching time and high linearity. These advantages make monolithic design ideal for implementation of a time discrimination function.

U.S. Pat. No. 3,641,443 discloses a prior art time discriminator. However, the design disclosed therein does not lead itself to incorporation into an IC in a practical matter. In addition, the response of the known discriminator can be improved.

SUMMARY OF THE INVENTION

In accordance with the present invention, a GaAs time measurement chip is provided which measures time differences between successive periods in a waveform, and outputs a signal whose amplitude is proportional to the difference. In the preferred embodiment, the chip output signal possesses an amplitude equal to 1 volt per nanosecond of time difference between adjacent periods.

A signal possessing some variation in time periods is input to a ramp timing generator. The ramp timing generator determines the beginning and end of successive time periods in the waveform and generates appropriate timing signals to dual ramp generators. The ramp generators produce ramping voltages on alternate periods of the input and the output of each is sampled by sample and hold circuits. Outputs from the sample and hold circuits are then subtracted from each other in a difference amplifier. The difference voltage, which is proportional to the time period difference, is then resampled by an output sample and hold circuit. The resulting signal possesses an amplitude which is proportional to the time difference between successive periods in the input signal.

BRIEF DESCRIPTION OF THE DRAWINGS

Additional objects, advantages, and features of the present invention will become apparent from the following description and appended claims, taken in conjunction with the accompanying drawings in which:

DETAILED DESCRIPTION OF THE PREFERRED EMBODIMENTS

It should be understood that the following description of the preferred embodiment is merely exemplary in nature and is in no way intended to limit the invention of its applications or uses.

Figure 1:
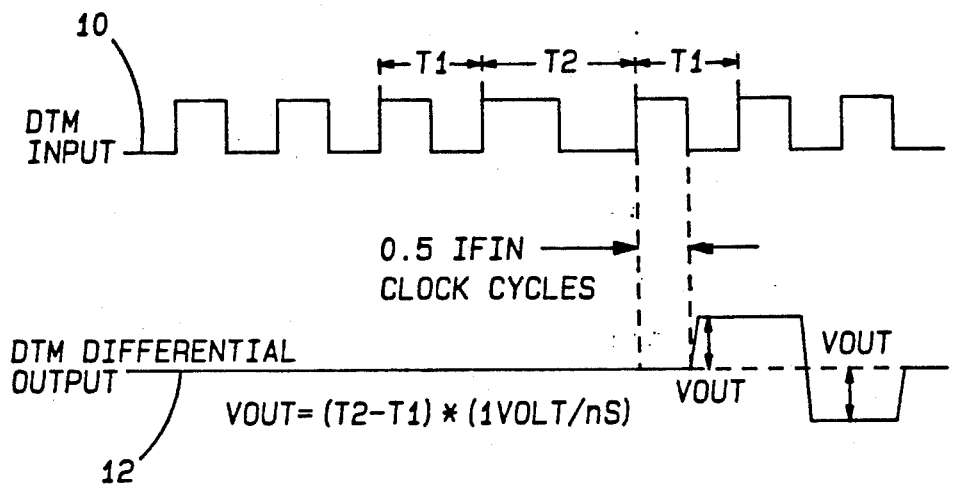
FIG. 1 demonstrates the basic functionality of the differential time measurement chip.

Referring now to the drawings, FIG. 1 demonstrates the function of the invention. Input signal 10, at frequency $1/T_1$, includes a brief transient frequency excursion to $1/T_2$, and then returns to $1/T_1$. The amplitude of the differential output signal 12 is 1 volt/nsec of time difference between adjacent periods. As demonstrated in FIG. 1, if the most recent input clock period is larger than the previous input clock period (T2>T1), the output 12 is positive. Conversely, if the most recent input clock period is shorter than the previous input clock period, the output 12 is negative. Incorporated into FIG. 1 is also a pipeline delay of one-half a period.

Figure 2:
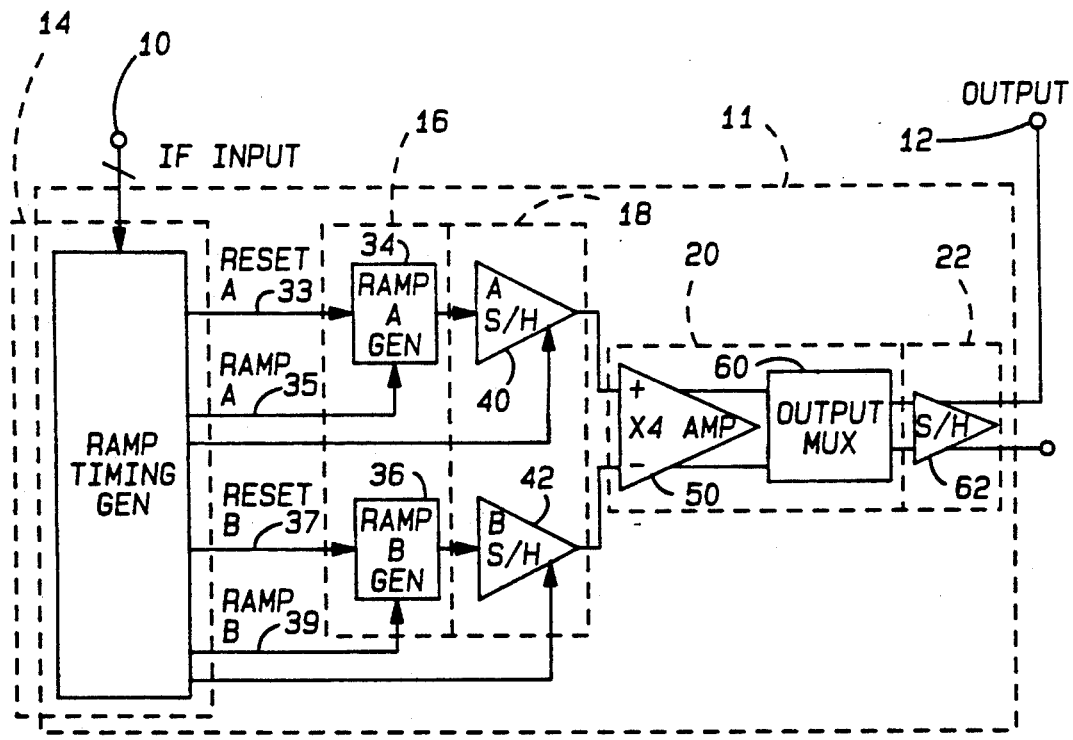
FIG. 2 is a block diagram of the circuit of the present invention.

Referencing FIG. 2, the differential time measurement chip 11 includes a sensing stage 14, a ramping stage 16, a storage stage 18, a logic stage 20, and an output stage 22. An input signal 10 is connected to the sensing stage 14, which determines the periods of the input signal and generates appropriate timing signals. The outputs of the sensing stage 14 are connected to the ramping stage 16, which generates ramp voltages. The values of successive ramp voltages are stored in the storage stage 18. Logic stage 20 compares the values contained in the storage stage 18 and generates voltage levels corresponding to differences in successive period lengths of the input signal 10. Output stage 22 resamples the voltage levels from the logic stage 20 and outputs the appropriate signal 12.

The specific stages of FIG. 2 will now be more fully described. The sensing stage 14 includes a ramp timing generator 32. The ramp timing generator 32, connected to the input signal 10, determines successive period time lengths. Ramp A 33 and reset A 35 timing signals correspond to the beginning and end of a first time period, while ramp B 37 and reset B 39 represent the beginning and end of a successive time period, respectively.

The ramping stage 16 includes two ramp generators, ramp generator A 34 and ramp generator B 36. Ramp generator A 34 receives as input the timing signals from the ramp timing generator, ramp A 33 and reset A 35. Similarly, ramp generator B 36 receives as input the timing signals ramp B 37 and reset B 39. Ramp generator A 34 outputs a ramping voltage corresponding to a first period of the input signal 10. At the end of the period, reset A 35 resets ramp generator A 34. Ramp generator B 36, similarly, outputs a ramping voltage corresponding to a successive period of the input signal 10. At the end of the successive period, reset B 39 resets ramp generator B 36. This procedure is repeated throughout successive periods of the input signal 10.

The storage stage 18 includes sample and hold circuit A 40 and sample and hold circuit B 42. Sample and hold circuit A 40 is connected to ramp generator A 34 and the ramp timing generator 32. Sample and hold circuit B 42 is connected to ramp generator B 36 and the ramp timing generator 32. The outputs from ramp generator A 34 are sampled by sample and hold A 40, while the outputs from ramp generator B 36 are sampled by sample and hold B 42.

The logic stage 20 includes a difference amplifier 50. The outputs from sample and hold circuit A 40 and sample and hold circuit B 42 are input to the difference amplifier 50. The difference amplifier 50 subtracts the sample and hold circuit outputs from each other and amplifies the difference. This difference voltage is proportional to the time difference between successive periods of the input signal 10.

The output of the difference amplifier 50 is input to a multiplexer 60. The multiplexer 60 selects the appropriate voltage level and outputs the result to a sample and hold circuit 62 in the output stage 22. Sample and hold circuit 62 resamples the difference voltage and outputs the appropriate analog voltage signal 14.

While the present invention can be implemented with discrete components, optimal performance is obtained by implementing it as an integrated circuit, employing monolithic GaAs design.

There are many advantages of the present invention. For example, resolution of 1 psec is obtainable. Further, due to the better device matching and high linearity associated with monolithic design, power consumption is reduced.

While this invention has been disclosed herein in connection with a particular example thereof, no limitation is intended thereby except as defined by the following claims. This is because the skilled practitioner will recognize that other modifications can be made from the spirit of this invention after studying the specifications and drawings.

What is claimed is:

1. A single chip system for measuring the time difference between successive periods in a waveform, comprising:
    sensing means, coupled to an input signal, for sensing periods of said input signal;
    ramp generator means, coupled to said sensing means, for producing ramping waveforms on successive periods of said input signal;
    storage means, connected to said ramp generator means, for sampling and holding outputs of said ramp generator means;
    logic means, coupled to said storage means, for comparing outputs from said storage means and creating output voltage levels; and
    output means, connected to said logic means, for selecting and outputting an appropriate voltage signal.

2. The chip, according to claim 1, being built on a dielectric substrate of gallium arsenide.

3. The chip, according to claim 1, wherein said sensing means comprises: a ramp timing generator connected to said input signal, wherein said timing generator controls timing signals of said system.

4. The chip, according to claim 3, wherein said ramp generator means comprises:
    a first ramp generator connected to first outputs of said ramp timing generator; and
    a second ramp generator connected to second outputs of said ramp timing generator.

5. The chip, according to claim 4, wherein said storage means comprises:
    a first sample and hold circuit coupled to an output of said first ramp generator and to said ramp timing generator; and
    a second sample and hold circuit coupled to an output of said second ramp generator and to said ramp timing generator.

6. The chip, according to claim 5, wherein said logic means comprises:
    a difference amplifier connected to the outputs of said first and second sample and hold circuits; and
    a multiplexer coupled to said difference amplifier, wherein said multiplexer selects an appropriate output from said difference amplifier.

7. The chip, according to claim 6, wherein said output means comprises:
    a third sample and hold circuit coupled to said multiplexer for resampling said output from said multiplexer and generating an appropriate voltage signal.

8. A method of measuring time differences between successive periods of an input signal, and generating output signals corresponding to said differences, said method comprising the steps of:
    a. inputting said input signal to a sensing means, and outputting appropriate timing signals;
    b. generating ramp voltages on successive periods of said input signal, wherein values of said ramp voltages are proportional to the lengths of said successive periods;
    c. storing values of said ramp voltages in first and second sample and hold circuits;
    d. comparing said stored values of said ramp generators and generating voltage levels corresponding to differences in successive period lengths of said ramp voltages; and
    e. selecting and resampling said voltage levels and outputting an appropriate voltage signal.

9. The method of claim 8, wherein step a. further comprises:
    determining successive period lengths of said input signal; and
    generating timing signals corresponding to the beginning and end of each said period of said input signal.

10. The method of claim 8, wherein step d. further comprises:
    inputting the signals from said first and second sample and hold circuits to a difference amplifier;
    determining time differences of successive period lengths; and
    generating signals which are proportional to said time differences.

11. The method of claim 8, wherein step e. further comprises:
    inputting said voltage signals which are proportional to said time differences to a first multiplexer;
    selecting appropriate voltage signals; and
    resampling said voltage signals and outputting signals that directly relate to the time differences of successive periods of the input signal.

* * * * *